(12) United States Patent
Baker et al.

(10) Patent No.: US 8,456,319 B2
(45) Date of Patent: Jun. 4, 2013

(54) SWITCH ARRANGEMENT FOR A LIGHTING DEVICE

(75) Inventors: Robert H. Baker, Miranda (AU); David R. Dulton, Joadja (AU); Patrick M. Conrick, Bardwell Valley (AU)

(73) Assignee: Eveready Battery Company, Inc., St. Louis, MO (US)

( * ) Notice: Subject to any disclaimer, the term of this patent is extended or adjusted under 35 U.S.C. 154(b) by 919 days.

(21) Appl. No.: 12/227,305

(22) PCT Filed: May 18, 2007

(86) PCT No.: PCT/US2007/069221
§ 371 (c)(1),
(2), (4) Date: Aug. 31, 2009

(87) PCT Pub. No.: WO2008/153556
PCT Pub. Date: Dec. 18, 2008

(65) Prior Publication Data
US 2010/0171633 A1    Jul. 8, 2010

(51) Int. Cl.
*G08B 5/22* (2006.01)
*G08B 21/00* (2006.01)
*G08B 23/00* (2006.01)

(52) U.S. Cl.
USPC ...... 340/815.45; 340/644; 340/654; 340/687; 340/693.5; 340/321

(58) Field of Classification Search
None
See application file for complete search history.

(56) References Cited

U.S. PATENT DOCUMENTS

| | | | |
|---|---|---|---|
| 3,879,618 A | 4/1975 | Larson | |
| 5,409,239 A | 4/1995 | Tremmel | |
| 5,669,834 A * | 9/1997 | Slupskiy | 473/459 |
| 6,100,794 A * | 8/2000 | Hillier | 340/431 |
| 6,388,390 B2 * | 5/2002 | Rachwal | 315/200 R |
| 6,502,949 B1 * | 1/2003 | Horiyama et al. | 362/119 |
| 7,033,040 B2 * | 4/2006 | Spahr et al. | 362/155 |
| 7,172,313 B2 * | 2/2007 | Abel et al. | 362/205 |
| 7,185,999 B2 * | 3/2007 | Lui | 362/157 |
| 7,328,479 B2 * | 2/2008 | Willenbring | 15/324 |
| 7,657,814 B2 * | 2/2010 | Schuster et al. | 714/746 |
| 7,718,906 B2 * | 5/2010 | Au et al. | 200/52 R |
| 7,952,290 B2 * | 5/2011 | Huang | 315/77 |
| 2003/0016533 A1 * | 1/2003 | Forsythe | 362/204 |
| 2005/0213317 A1 * | 9/2005 | Lui | 362/157 |
| 2008/0165527 A1 * | 7/2008 | VanderSchuit | 362/133 |
| 2009/0218961 A1 * | 9/2009 | Kang et al. | 315/307 |

FOREIGN PATENT DOCUMENTS

| | | |
|---|---|---|
| EP | 0012044 A1 | 6/1980 |
| FR | 2585802 A1 | 2/1987 |
| GB | 1202933 A | 8/1970 |

OTHER PUBLICATIONS

Patent Cooperation Treaty (PCT), International Search Report and Written Opinion for Application No. PCT/US2007/069221, filed May 18, 2007, mailed Feb. 10, 2010, European Patent Office, Netherlands.

* cited by examiner

*Primary Examiner* — Julie Lieu
(74) *Attorney, Agent, or Firm* — Eveready Battery Company, INC (57) ABSTRACT

A lighting device includes a touch switch with touch contacts 304, 306, located on the grip of the lighting device is that the light 312 can be turned on when the contacts are bridged by the hand of a user. An electronic circuit 300 includes a latching arrangement 302, 316 to latch the light on. The light can be dimmed by use of a further touch contact 308.

23 Claims, 9 Drawing Sheets

SWITCH ARRANGEMENT FOR A LIGHTING DEVICE

CROSS-REFERENCE TO RELATED APPLICATION

This application claims priority of Australian Provisional Application No. 2006902713 filed on May 19, 2006, the disclosure of which is hereby incorporated herein by reference.

FIELD OF THE INVENTION

This invention relates to the switching of portable electrical devices such as flashlights.

BACKGROUND OF THE INVENTION

Flashlights usually have a light bulb mounted at the front of a housing which contains batteries. A mechanical switch is provided to connect the light bulb to the batteries when the user wishes to use the flashlight. Often, flashlights need to be operated in the dark under adverse conditions, so it is desirable to provide a readily operable switch mechanism. It is also desirable to provide a flashlight where the batteries are not inadvertently discharged. Weatherproofing can also be a requirement of a flashlight.

SUMMARY OF THE INVENTION

This invention provides a lighting device which includes a first sensor switch having a proximity contact arrangement which detects when the device is touched by the user, gripped by the user, or when the user is sufficiently proximate to the first sensor switch and operates an electronic switch circuit to activate a light source.

The first sensor switch can include a first contact arrangement arranged to operate when the user grips the lighting device.

The lighting device can also include a second sensor switch which operates to turn the light switch off after it has been turned on.

The lighting device can also include a third sensor switch by which the user can turn the light source on after it has been turned off by the second sensor switch.

The lighting device can include a sensor switch and associated control circuitry to regulate the current through the light source.

One or more of the sensor switches can include a touch contact.

One or more of the sensor switches can include a proximity sensing element.

The electronic switch circuit can include a latching arrangement.

The electronic switch circuit can include an SCR.

The first sensor switch can be connected to turn the SCR on.

The SCR can be turned off by a first transistor switch in series with the SCR.

The first transistor switch can be biased on when the SCR is turned on.

The second sensor switch is connected to turn the first transistor switch off.

The third sensor switch can be connected to switch the first transistor switch on.

The electronic switch can include a MOSFET.

The electronic switch can include a capacitor bridging the gate and drain of the MOSFET, and the first sensor switch can be arranged to charge the capacitor through the skin resistance of a user bridging the touch contacts of the first sensor switch.

The electronic switch can include a discharge switch including a touch contact providing a path to ground through the user's skin resistance to reduce the charge on the capacitor.

The lighting device can include a movable cover to cover at least one of the proximity contacts when the proximity contacts are not in use.

The cover can be a sliding cover.

The cover can be spring biased to cover the or each contact.

The cover can be pivoted or hinged.

The lighting device can have a magnetically actuable switch.

A movable magnet can be provided on the outside of the housing, and the switch is inside the housing.

The lighting device can include a movable element carrying a magnet which, when moved into proximity with a magnetically operable switch, operates the magnetic switch.

The lighting device can include a movable element carrying a movable switch operating member mounted on the exterior of the lighting device and adapted to operate a switch within the housing through a hole in the wall of the device.

The switch operating member can act on the switch through a resilient closure.

The magnet can be movable to operate at least one of at least two magnetic switches.

These and other features, advantages and objects of the present invention will be further understood and appreciated by those skilled in the art by reference to the following specification, claims and appended drawings.

BRIEF DESCRIPTION OF THE DRAWINGS

Embodiments of the present invention will now be described, by way of example only, with reference to the accompanying drawings, in which.

DETAILED DESCRIPTION OF PREFERRED EMBODIMENTS

In this specification, the term "proximity sensor," "proximity switch," "proximity contact" and the like are used to refer to a contact arrangement which detects either contact with a user or the proximity of a user to the contact. The proximity contact arrangement can be responsive to either resistance or capacitance, and can be passive or active.

Figure 1:
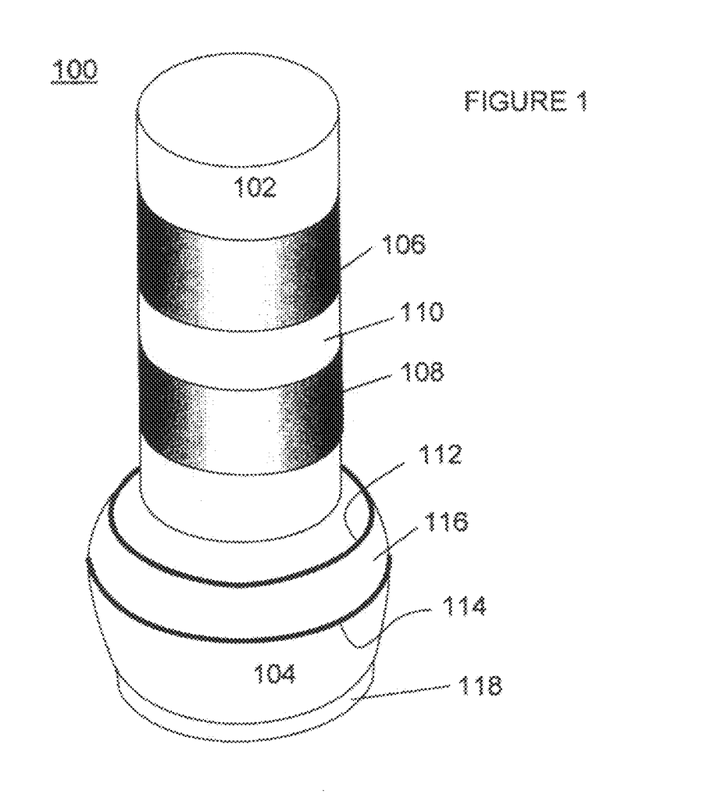
FIG. 1 shows a flashlight including a switching arrangement according to an embodiment of the invention.

With reference to FIG. 1, there is shown a flashlight 100 having an elongate body 102, and a forward lens housing 104. The elongate body 102 is adapted to contact the power source, which can be, for example one or more batteries or capacitors.

The lens housing 104 can contain a conventional reflector and light source arrangement. The light source can be, for example, a LED, a xenon light, an incandescent light, or a halogen light.

The flashlight does not require a conventional mechanical switch to turn the light on. Instead, it uses first and second touch pads 106, 108 which, in use, the user bridges in picking up the flashlight by grasping the elongate body 102 with a hand. The touch pads 106, 108 are separated by an insulating space 110, and the user's hand bridges the insulating space so that the skin resistance of the user connects the touch pads 106, 108. The first and second touch pads 106, 108 are configured as first and second contacts made of an electrically conductive material, according to one embodiment. In this embodiment, contact by the user's skin provides a resistance in an electrical current path to bridge the gap between the first and second contacts to activate the light source.

The flashlight includes operating circuitry adapted to respond to the bridging of the touch pads 106, 108 to switch the flashlight on.

In addition third and fourth touch contacts 112, 114 are provided for use in switching the flashlight off and for switching the flashlight on after it has been switched off. The third and fourth touch contacts 112, 114 are likewise made of an electrically conductive material and are spaced from each other and from other contacts by insulating spaces, according to one embodiment.

While the first and second touch pads are shown as circumferential rings, other shapes can be used. Preferably the shape, size, location and relative position of the first and second touch pads is such that, when the flashlight is picked up, the touch pads 106, 108 will be bridged by the user's hand.

Thus, the flashlight of FIG. 1 will turn on when it is picked up.

A further feature of the flashlight of FIG. 1 is a translucent ring 118 located to permit light from the light source or light reflected from the reflector to pass through the ring. This enables the flashlight to be seen when the flashlight is placed to stand on the front end and the light source is emitting light. The ring 118 can be clear or colored. The ring can be made of a soft plastics material to also protect the flashlight in case of impact at the front rim.

Figures 4, 5:
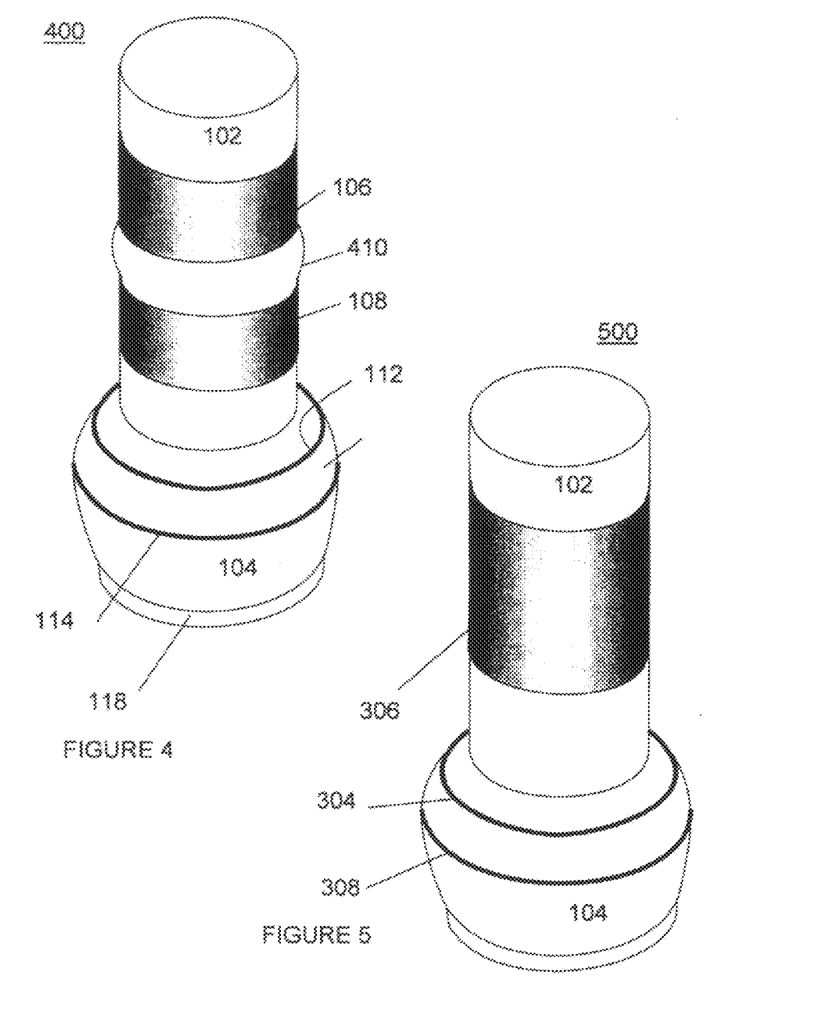
FIG. 4 shows a variation of the flashlight of FIG. 1.
FIG. 5 illustrates a view of a flashlight suitable for use with a proximity or touch switch.

The flashlight of FIG. 4 corresponds with the flashlight of FIG. 1 with the exception that the insulation gap 410 between the grip switch contacts is convex. This assists in preventing inadvertent bridging of the contacts 106, 108.

Figure 2:
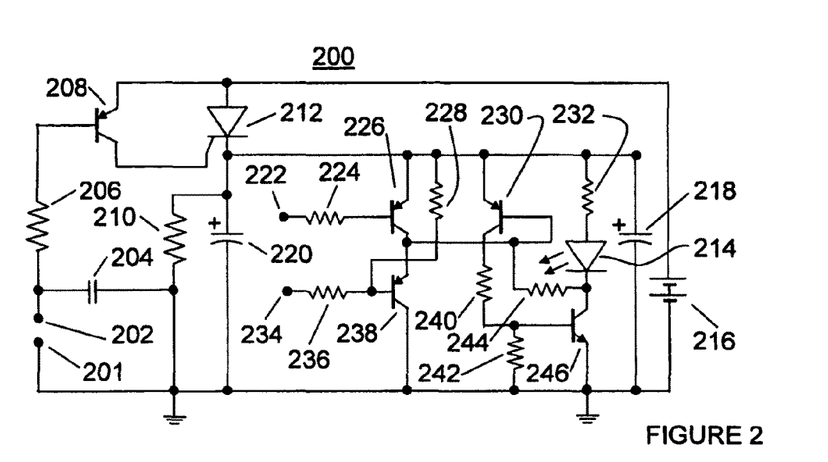
FIG. 2 is a first circuit diagram of a switching circuit using a proximity or touch switch.

FIG. 2 illustrates a first switching circuit adapted for use with a flashlight having a touch switch.

A battery 216 provides power supply for the circuit. The negative side of the battery supply is shown as connected to ground, and the positive side is connected to the supply rail of the circuit.

The circuit 200 includes a first set of touch pads 201, 202 which are to the base of PNP transistor 208 via resistor 206. Effectively, the base of transistor 208 is floating at the voltage of capacitor 204 while the contacts 201, 202 are unbridged by contact with the user. Transistor 208 connects the anode and the gate of SCR 212, so that transistor 208 turns the SCR on when the contacts 201, 202 are bridged by the user gripping the flashlight.

A light source, such as white LED 214 is connected in series with the SCR 212.

An NPN transistor 246 is connected in series with the LED 214. The base of transistor 246 is connected to its emitter via resistor 242, so that transistor 246 is biased on. Thus, when the contacts 201, 202 are activated by the user, the SCR is turned on via transistor 208 and the current from the SCR flows through LED 214 and transistor 246.

Thus, when a user picks up the flashlight by grasping the portion of the housing containing the first touch switch contacts 201, 202, it will automatically turn on.

Once SCR 212 is turned on it remains on irrespective of its gate voltage. Thus, the SCR 212 acts as an on latch.

As the SCR 212 is independent of its gate signal once it is turned on, the user can put the flashlight down and it will remain on.

When the user is carrying the flashlight and wishes to turn the light off, the user touches contact 222. As the user is also contacting common contact 201, this turns PNP transistor 226 on, which in turn turns PNP transistor 230 on and connects the base of transistor 246 to the cathode of SCR 212 via resistor 240. The collector of transistor 246 is likewise connected to the cathode of SCR 212 via resistor 244 and transistor 226. Resistors 240 and 242 bias the transistor 246 off. Thus, when the user contacts touch pad 222, transistor 246 is turned off.

When the user is not touching the contact 222, the base of transistor 226 is floating.

When transistor 246 is turned off, the SCR 212 is turned off. This isolates the cathode of SCR 212 from the supply voltage 216.

Capacitors 218 and 220 are grounded via resistor 210.

However, while the user is gripping the flashlight and bridging the contacts 201, 202, transistor 208 will be biased on, so that the SCR 212 can turn on when a conduction path becomes available. Thus the user can turn the flashlight on by touching touch contact 234.

The base of transistor 238 is connected to the cathode of SCR 212 via resistor 228. Thus, transistor 238 is held off until the user touches touch contact 234. This connects the collector of transistor 226 and the base of transistor 230 to ground via transistor 238, switching transistor 230 off and thus changing the base bias of transistor 246 so that it is connected to ground via resistor 242. Thus, transistor 242 switches on and the LED 214 is energized. Again, the SCR 212, remains on until the user touches the contact 222.

Figure 3:
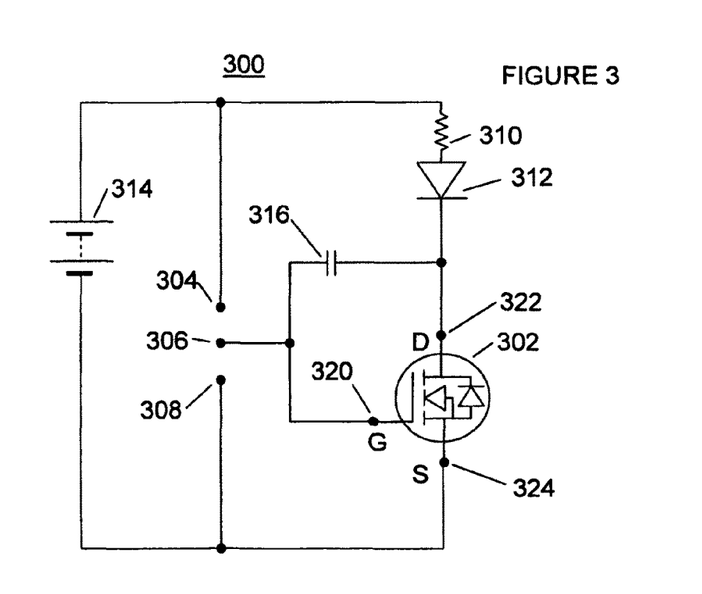
FIG. 3 is a second circuit diagram of a switching circuit.

Alternative flashlight and circuit arrangements are shown with reference to FIG. 3 and FIG. 5.

The features of FIG. 5 correspond generally to those of FIG. 1 with the exception that there is a single grip switch contact 306 corresponding to common touch contact 306 of FIG. 3, an on touch contact 304, and an off contact 308 also corresponding to the like numbered features of FIG. 3.

In the embodiment of FIG. 3, the switching circuit 300 uses MOSFET 302. The MOSFET 302 has gate terminal 320, drain terminal 322, and source terminal 324. A light source, again shown as a white LED 312 and load resistor 310 are connected in the source/drain path of the MOSFET 302.

A battery supply 314 powers the circuit.

An "on" touch terminal, 304, an "off" touch terminal, 308, and a common touch terminal 306 are provided on the exterior of the flashlight so that they are accessible to the user. Preferably, the common terminal 306 is arranged as a grip contact so that, when the user grips the flashlight, the on terminal 304 can be readily touched to bridge the on terminal 304 and the common terminal 306.

The common terminal 306 is connected to the gate 320 of MOSFET 302, and via capacitor 316 to the drain 322 of MOSFET 302.

When the user bridges the on terminal 304 and common terminal 306, the gate 320 is connected to the positive side of the battery supply via the user's skin resistance. The capacitor 316 is charged through the user's skin resistance across terminals 304, 306, the charging voltage being the voltage across LED 312 and resistor 310. The charge on the capacitor controls the current through the MOSFET source/drain path. Thus, the MOSFET 302 is turned on. The level of charge across capacitor 316 is determined by the time the user bridges the contacts 304, 306. The LED illumination will build up as the charge on the capacitor 316 builds up and the MOSFET 302 becomes more conducting.

Thus, the illumination from the LED 312 can be continuously varied.

If it is desired to reduce the illumination from the LED, the user bridges common terminal 306 and off terminal 308 for a time so that the charge of the capacitor 316 is reduced.

The LED 312 can be turned off, or the light emitted by the LED can be reduced to a minimum, by bridging the common terminal and the off terminal 308 for a sufficient time to drain the capacitor 316 to a level below the level required to turn the MOSFET 302 on. The LED 312 can have a significant turn on voltage of the order of three volts or more.

Leakage current may still flow and cause an LED to emit light at a current level which is too low to cause an incandescent bulb to emit light. This characteristic can be used to provide a "find me" feature in a flashlight which uses an LED as the light source, in that the low level of illumination from the LED in the off state will make the flashlight visible in low ambient light conditions. Thus, in the case where the flashlight has a translucent rim (18 in FIG. 5), the flashlight can be located even when the flashlight is standing with the rim as a base.

An auxiliary LED (not shown) which produces visible light at low powers can be used in parallel with the light source as a visible indicator of the current at low current levels. Preferably the auxiliary LED emits light in the region of high sensitivity of the human eye, such as an orange or red LED. Preferably the auxiliary LED emits light in the wavelength region of 565 to 600 NM. The user can thus use the auxiliary LED as an indicator of when the leakage current has been reduced to a minimum. The auxiliary LED can be arranged in series with the light source. Alternatively, the auxiliary LED can be arranged in parallel with the light source.

Where it is desired to minimize or eliminate leakage current through the LED, additional circuitry can be included to reduce the leakage current to approximately zero. Alternatively, a mechanical cut-off or isolation switch can be provided.

A supply voltage 314 of 4.5 volts or above can be used to operate the flashlight.

The time constants of the turn on path via touch contact 304 and turn off path via touch contact 308 can be adjusted by varying the size of the capacitor 316 and/or by including additional resistance in the circuits. Thus, to increase the time constant for the turn off path, a resistor could be added in the turn off path between touch contact 308 and the negative rail of battery supply 314.

The circuit of FIG. 3 provides a useful control arrangement with a small component count.

The flashlight housing can be made of any suitable material or combinations thereof. Preferably, the material is chosen to avoid inadvertent operation of the touch switch due to static electricity. Thus, a plastics material which prevents the build up of static electricity can be used. Alternatively, the body can be of a conductive material such as aluminum or other conductive material, and the touch contacts separated from the main body by an insulating layer. The individual touch contacts are electrically conductive and must be mutually electrically insulated from one another.

Figure 6:
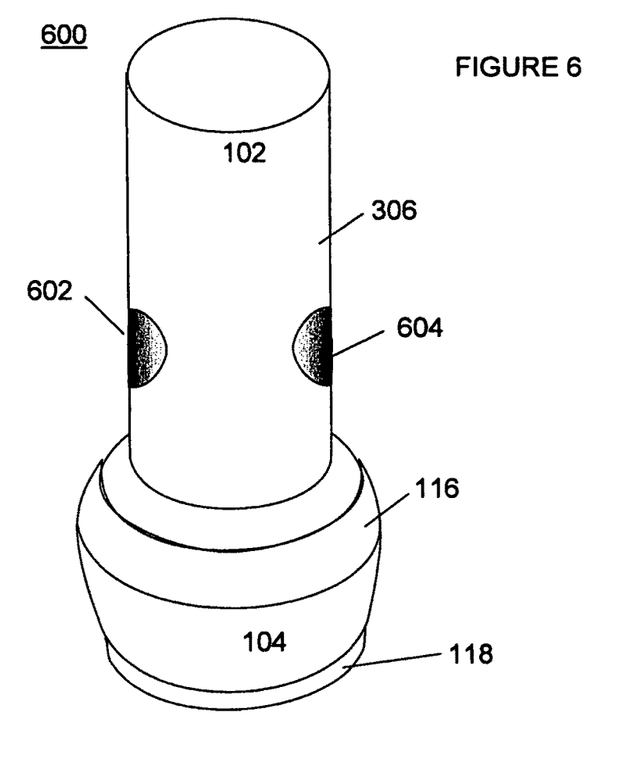
FIG. 6 shows another flashlight suitable for use with a proximity or touch switch.

In FIG. 6, the ring contacts 106, 108 of FIG. 1 have been replaced by spot or bulbous contacts 602, 604. These contacts can be located on the body 102 of the flashlight 600 in positions which minimize the likelihood of accidental bridging of the contacts. As shown, the curve of the housing 102 prevents a straight object from bridging the contacts.

A further embodiment of the invention includes a cover for covering at least one of the touch contacts when the touch switch is not in use to prevent accidental operation of the switch. FIGS. 7 to 11 show a cover arrangement adapted to protect the contacts 706 from accidental operation. The contacts 706 are housed in a recess 708 and a cover 710 is provided to cover the contacts 706 when they are not being used. In the embodiment in FIG. 7, the cover 710 is slidable in to expose the contacts when they are required for use. An indentation or recess 712 is provided on the cover 710 to facilitate pushing the cover with a finger or thumb.

Figures 7, 8, 9:
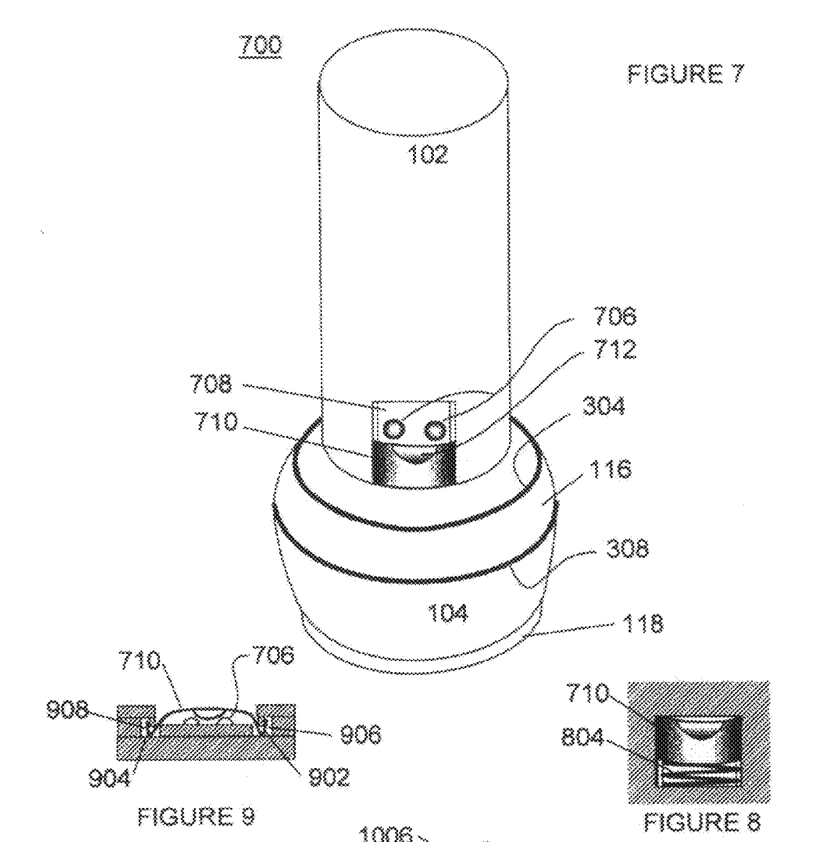
FIG. 7 illustrates a further flashlight.
FIG. 8 illustrates the contact cover of FIG. 7.
FIG. 9 is a section view of the contact cover arrangement of FIG. 7.

FIG. 8 shows the cover 710 of FIG. 7 provided with a resilient member 804, shown here as a spring. However, the resilient member 804 could be any suitable member, such as a resilient plastics member. The resilient member 804 serves to push the cover 710 to cover the contacts when the contacts are not being used. Thus, in order to operate the flashlight, a user simply needs to push the cover to expose the contacts 706 and the finger or thumb of the user can also bridge the contacts in the same action as opening the cover. When the finger or thumb is withdrawn, the cover will automatically be pushed by the resilient member 804 to cover the contacts 706.

FIG. 9 illustrates a section view of an embodiment of the cover arrangement of FIG. 7. The edges 902, 904 of the cover 710 are formed to engage with corresponding channels, rails, or grooves 906, 908. The cover can be sufficiently resilient or flexible to enable it to be pressed into the cavity and flex to permit the edges 902, 904 to engage the channels. The cover is somewhat domed to accommodate the contacts 706.

Figure 10:
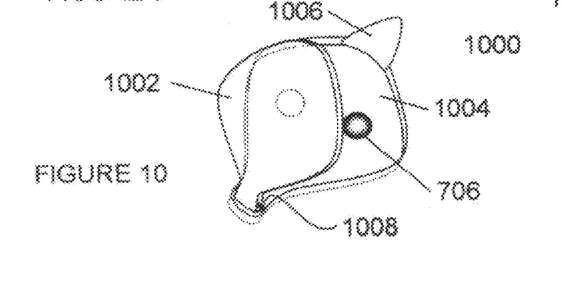
FIG. 10 shows detail of a further contact cover arrangement.

FIG. 10 shows a further contact cover arrangement 1000 suitable for use in an embodiment of the invention.

The contacts 706 (one shown in dotted outline), are located in a recess 1004, and cover 1002 is provided to cover the contacts 706 when not in use. The cover 1002 can be a press fit or snap fit in the recess 1004 to retain it in place. A cut out 1006 can be provided in the edge of the recess 1004 to facilitate lifting the cover 1002. When the cover is lifted, the user can bridge the contacts 706 to operate the flashlight.

The cover can be attached to the body of the flashlight by any suitable means. A pivot pin 1008 is shown anchoring the cover to the inner walls of the recess 1004. However, the cover and surrounding housing material can be sufficiently flexible to permit the cover to be formed integrally with the surrounding housing without the need for a pivot.

Figure 11:
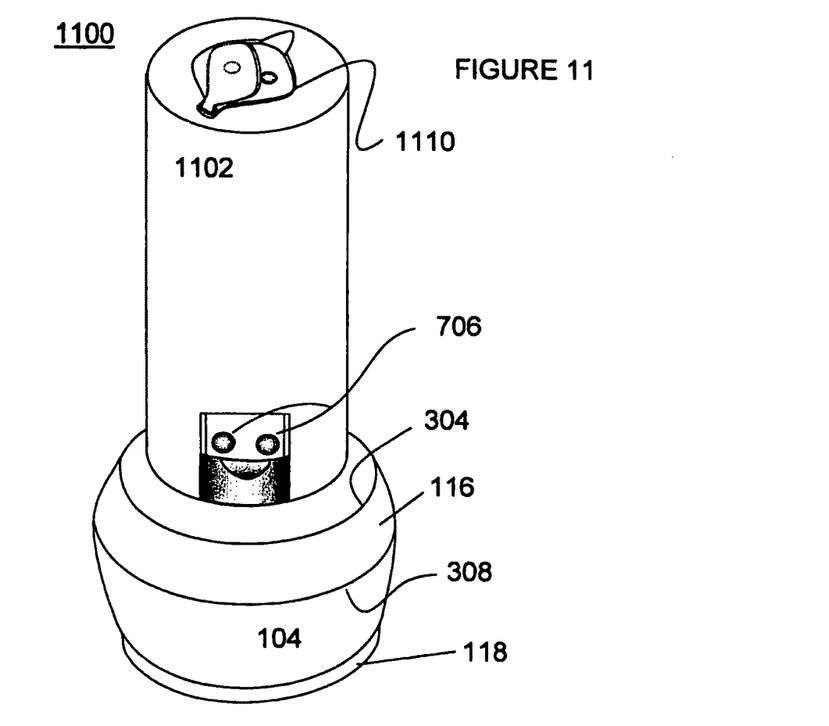
FIG. 11 illustrates a flashlight similar to that of FIG. 7 embodying the contact cover arrangement of FIG. 10.

FIG. 11 shows a contact cover arrangement of FIG. 10 applied to a flashlight of FIG. 7.

Figure 12:
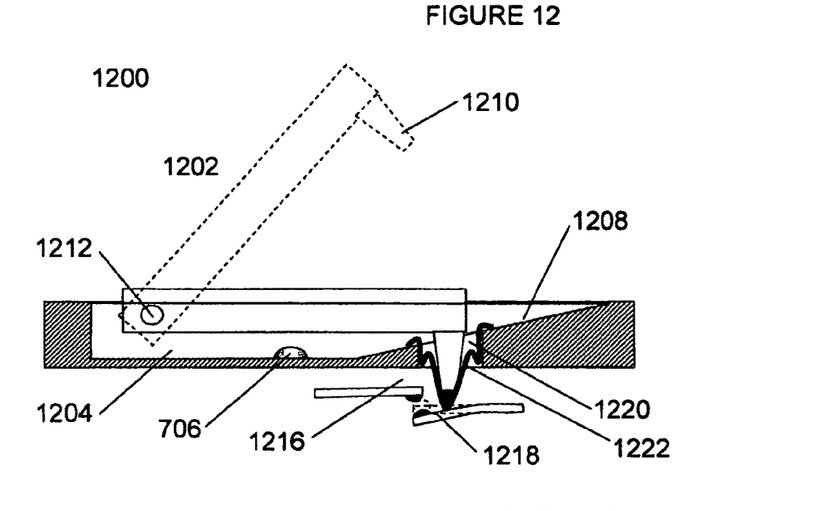
FIG. 12 shows a further embodiment of the invention in which a metal contact arrangement is provided to isolate the battery from the electrical circuit when the flashlight is not in use.

FIG. 12 shows a side view of a switch and cover arrangement in which a metal contact arrangement is provided to isolate the battery from the electrical circuit when the flashlight is not in use.

One of the touch contacts 706 is shown in recess 1204.

A pivoting cover 1202 includes a switch operating member, shown in FIG. 12 as projection 1210, adapted to actuate a mechanical switch having contacts 1216, 1218, at least contact 1218 being resilient and being mounted to permit it to deflect when it is the projection 1210 acts on it. A hole 1220 is provided in the housing to permit projection 1210 to pass through the wall of the housing and operate contact 1218. The actuator in FIG. 12 is adapted to open the contacts when the cover 1202 is closed. When the cover 1202 is open, the contact 1218 is normally closed so that it contacts contact 1216. When the cover closes, contact 1218 is forced away from contact 1216 by projection 1210.

While FIG. 12 shows an arrangement in which the contacts are normally closed, and the projection 1210 opens the contacts, the arrangement is also applicable in the case where the contacts are normally open and the projection closes the contacts.

A flexible or resilient cover 1222, such as a membrane or grommet or other suitable closure, can be provided over hole 1220 to provide weatherproofing while permitting projection 1210 to operate the contact 1218 by resiliently deforming the membrane. Alternatively, a plug can be provided to close hole 1220 when the cover 1202 is open.

In an alternative arrangement, the actuator can be a cam attached at the pivot end of the cover.

Figure 13:
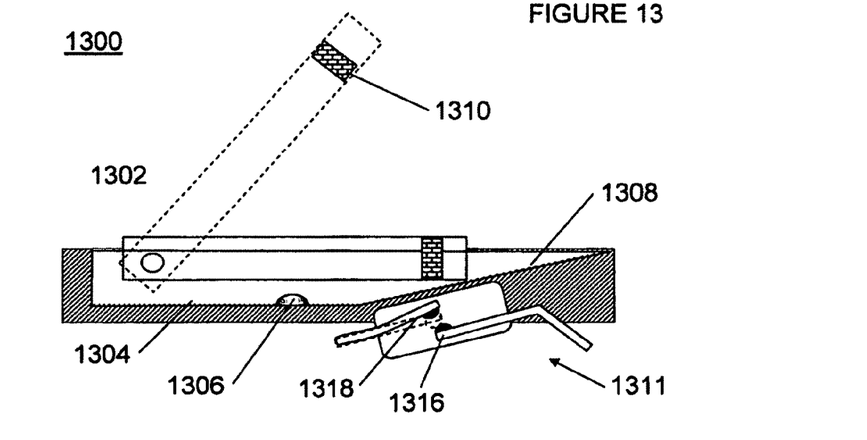
FIG. 13 shows an arrangement for operating a magnetic switch.

FIG. 13 shows an alternative arrangement which does not require a hole through the wall of the housing to operate the switch contacts. In this arrangement, a magnetic reed switch 1311 is provided. This switch has a pair of contacts 1316, 1318 which are normally closed, but which can be opened by magnet 1310 in proximity to the contacts. The contact 1318 can be magnetically susceptible so as to be attracted to the magnet 1310 and spring biased to close the contacts 1318, 1316 while contact 1316 can be fixed or non-magnetic. Thus, when the magnet is sufficiently close to overcome the spring bias, the contacts open, but when the magnet is removed the spring bias closes the contacts, as shown in dotted outline.

While the magnet has been shown as mounted on a pivoting cover, it can be mounted on any suitable moving member. For example, the magnet could be mounted on a sliding switch operating mechanism.

The magnetic switch arrangement does not require physical access to the interior of the device. This improves the weatherproofing of the device.

Figure 14:
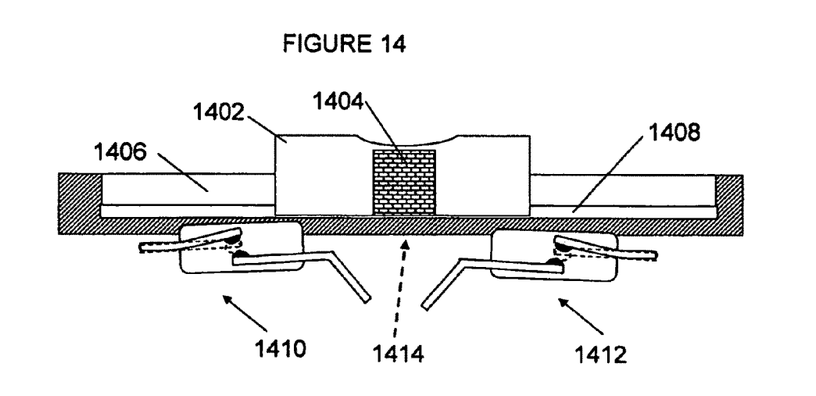
FIG. 14 shows an arrangement for operating a multi-position magnetic switch.

FIG. 14 shows a multi-position magnetic switch arrangement. A magnet 1404 is mounted on a sliding switch operating member 1402 in a switch recess 1406 in which the operating member 1402 is adapted to slide.

A pair of magnetically operated switches 1410, 1412 are mounted below the recess 1406 so that the magnet can be moved into operative proximity to either switch by the user. The operating member 1402 is shown in an intermediate position 1414 in which the magnetic influence of the magnet does not affect either switch 1410 or 1412. However, when the switch member 1402 is slid to the left it operates switch 1410, and when it is slid to the right of the intermediate position it operates switch 1412.

The switches 1410 and 1412 can be either normally closed or normally open, depending on their function within the device. In either case, they can be arranged so that the magnet will switch them from their normal state to the other state. This arrangement is quite versatile and two or more magnets and two or more switches can be provided to implement various switching configurations and operating states.

Figure 15:
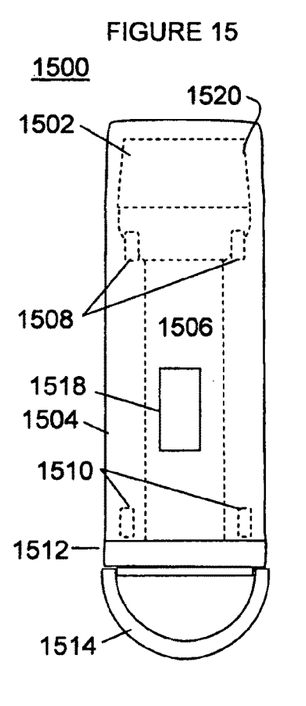
FIG. 15 shows an all-around light with a covered switch in the base.

FIG. 15 shows another flashlight employing the switch and cover of FIG. 10. This flashlight has a forward facing directional lamp 1502 and an area light 1504 which surrounds an enclosure 1506 which can contain a power source such as batteries. The directional lamp 1502 can be a LED spotlight. LEDs 1508, 1510 provide the light source for the area light 1504. A based 1512 can be detached to provide access to the interior of the light distribution tube 1504. This also provides access to the interior of battery enclosure 1506 so that batteries can be changed.

The housing 1504 is translucent or transparent and is designed as a light distributor to distribute light from LEDs 1508, 1510.

A carry loop 1514 is pivoted to the base 1512 and is designed to fold flat into the base when not in use so the flashlight 1500 can stand upright on the base.

A translucent logo 1518 can be provided on the surface of the light distributor.

The shape of the light distributor and the enclosure, and the location of the LEDs can be arranged to produce lighting effects, such as dark lines in the light radiation pattern. The arrangement can also be arranged to eliminate dark lines. This flashlight can provide all-around lighting.

The "forward" end of the flashlight 1500 includes a spotlight with bulb or other light source and reflector and can include a wrap around lens 1520 to permit side lighting. This permits light to be emitted out the side of the wrap around lens so that, if the flashlight is placed on a table on the directional light, this can be detected and the user can turn the flashlight off to stop draining the battery. The wrap around lens 1520 can be formed in a single piece with the area light 1504.

Figure 16:
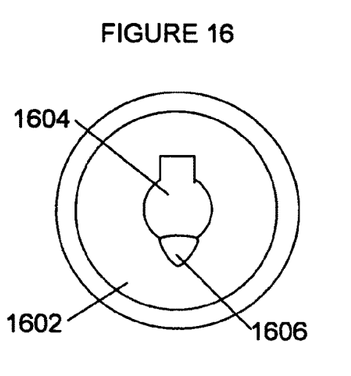
FIG. 16 shows the switch cover in the base of the light of FIG. 15.

A switch is included in the base 1512. As shown in FIG. 16, the switch is a proximity witch with a cover 1604 similar to that shown in FIG. 10. An access recess 1606 is provided to enable the cover to be lifted easily. Locating the switch in the base simplifies the electrical connections, as the batteries are also in contact with, or in close proximity to the base.

Wherever it is used, the word "comprising" is to be understood in its "open" sense, that is, in the sense of "including," and thus not limited to its "closed" sense, that is the sense of "consisting only of." A corresponding meaning is to be attributed to the corresponding words "comprise," "comprised" and "comprises" where they appear. Where terms referring to direction orientation and so on are used, they are to be understood in the context of the drawings rather than as absolute terms unless the absolute meaning is expressly recited or would be understood from the context.

It will be understood that the invention disclosed and defined herein extends to all alternative combinations of two or more of the individual features mentioned or evident from the text. All of these different combinations constitute various alternative aspects of the invention.

While particular embodiments of this invention have been described, it will be evident to those skilled in the art that the present invention may be embodied in other specific forms without departing from the essential characteristics thereof. The present embodiments and examples are therefore to be considered in all respects as illustrative and not restrictive, and all modifications which would be obvious to those skilled in the art are therefore intended to be embraced therein.

The invention claimed is:

1. A lighting device comprising a first sensor switch having a proximity contact arrangement that is operated by a user to operate an electronic switch circuit which activates a light source, wherein the contact arrangement comprises a first contact and a second contact separated by an insulating space, wherein a user bridges the insulating space between the first and second contacts so that resistance of the user connects the first and second contacts to activate the light source; and a second sensor switch that operates to turn the light switch off after it has been turned on.

2. The lighting device as defined in claim 1, wherein the first and second touch contacts are located on a grip of the lighting device, such that the light source is activated when the user grips the lighting device.

3. The lighting device as defined in claim 1 further comprising a third sensor switch by which the user can turn the light source on after it has been turned off by the second sensor switch.

4. The lighting device as defined in claim 1, wherein he electronic switch circuit comprises a latching arrangement.

5. The lighting device as defined in claim 1, wherein the lighting device comprises a portable handheld lighting device.

6. A lighting device comprising a first sensor switch having a proximity contact arrangement that is operated by a user to operate an electronic switch circuit which activates a light source, wherein the contact arrangement comprises a first contact and a second contact separated by an insulating space, wherein a user bridges the insulating space between the first and second contacts so that resistance of the user connects the first and second contacts to activate the light source, wherein the electronic switch circuit comprises an SCR, wherein the first sensor is connected to turn the SCR on; and further comprising a first transistor switch in series with the SCR, wherein the SCR can be turned off by the first transistor switch.

7. The lighting device as defined in claim 6, wherein the first transistor switch is biased on when the SCR is turned on.

8. The lighting device as defined in claim 7, wherein a second sensor switch is connected to turn the first transistor switch off.

9. The lighting device as defined in claim 8, wherein a third sensor switch is connected to switch the first transistor switch on.

10. A lighting device comprising a first sensor switch having a proximity contact arrangement that is operated by a user to operate an electronic switch circuit which activates a light source, wherein the contact arrangement comprises a first contact and a second contact separated by an insulating space, wherein a user bridges the insulating space between the first and second contacts so that resistance of the user connects the first and second contacts to activate the light source, wherein the electronic switch circuit comprises a MOSFET and a capacitor bridging a gate and a drain of the MOSFET.

11. A lighting device comprising a first sensor switch having a proximity contact arrangement that is operated by a user to operate an electronic switch circuit which activates a light source, wherein the contact arrangement comprises a first contact and a second contact separated by an insulating space, wherein a user bridges the insulating space between the first and second contacts so that resistance of the user connects the first and second contacts to activate the light source, further comprising a capacitor, wherein the first sensor switch is arranged to charge the capacitor through the skin resistance of a user bridging the first and second contacts of the first sensor switch.

12. The lighting device as defined in claim 11 further comprising a discharge switch including a third contact providing a path to ground through the user's skin resistance to reduce the charge on the capacitor.

13. A lighting device comprising a first sensor switch having a proximity contact arrangement that is operated by a user to operate an electronic switch circuit which activates a light source, wherein the contact arrangement comprises a first contact and a second contact separated by an insulating space, wherein a user bridges the insulating space between the first and second contacts so that resistance of the user connects the first and second contacts to activate the light source, further comprising an auxiliary LED arranged to provide a visual indication of the level of current.

14. A lighting device comprising a first sensor switch having a proximity contact arrangement that is operated by a user to operate an electronic switch circuit which activates a light source, wherein the contact arrangement comprises a first contact and a second contact separated by an insulating space wherein a user brides the insulating space between the first and second contacts so that resistance of the user connects the first and second contacts to activate the light source, further comprising a movable cover to cover at least one of the first and second contacts.

15. The lighting device as defined in claim 14, wherein the cover is a sliding cover.

16. The lighting device as defined in claim 15, wherein the cover is spring biased to a position that covers the at least one of the first and second contacts.

17. The lighting device as defined in claim 14 wherein the cover is pivoted.

18. The lighting device as defined in claim 14, wherein the insulating space comprises a convex surface.

19. The lighting device as defined in claim 14, wherein at least one of the first and second contacts comprise a bulbous touch pad.

20. A lighting device comprising a first sensor switch having a proximity contact arrangement that is operated by a user to operate an electronic switch circuit which activates a light source, wherein the contact arrangement comprises a first contact and a second contact separated by an insulating space, wherein a user bridges the insulating space between the first and second contacts so that resistance of the user connects the first and second contacts to activate the light source, further comprising a cover for covering at least one of the first and second contacts to prevent inadvertent actuation of the lighting device.

21. The lighting device as defined in claim 20 , wherein the cover comprises a magnet for actuating a switch.

22. The lighting device as defined in claim 20, wherein the resistance of the user comprises skin resistance.

23. The lighting device as defined in claim 20, wherein the first and second contacts comprises first and second touch pads.

* * * * *